United States Patent
Song et al.

(10) Patent No.: US 7,561,636 B2
(45) Date of Patent: Jul. 14, 2009

(54) DIGITAL PREDISTORTION APPARATUS AND METHOD IN POWER AMPLIFIER

(75) Inventors: Yoo-Seung Song, Suwon-si (KR); Jae-Hyok Lee, Seoul (KR); Seung-Hwan Lee, Seoul (KR); Ki-Hwan Hwang, Suwon-si (KR); Jae-Ho Jeon, Seongnam-si (KR); Seung-Joo Maeng, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 538 days.

(21) Appl. No.: 11/126,322

(22) Filed: May 11, 2005

(65) Prior Publication Data

US 2005/0253652 A1    Nov. 17, 2005

(30) Foreign Application Priority Data

May 11, 2004    (KR) .................. 10-2004-0033226

(51) Int. Cl.
*H04L 25/49* (2006.01)
*H04B 1/04* (2006.01)
(52) U.S. Cl. .................................. 375/297; 455/114.3
(58) Field of Classification Search ......... 375/295–297; 455/114.2, 114.3
See application file for complete search history.

(56) References Cited

U.S. PATENT DOCUMENTS

| 5,923,712 | A | * | 7/1999 | Leyendecker et al. | ........ 375/297 |
| 5,959,500 | A | * | 9/1999 | Garrido | ...................... 330/151 |
| 6,141,390 | A | * | 10/2000 | Cova | ........................... 375/297 |
| 6,236,837 | B1 | * | 5/2001 | Midya | ........................ 455/63.1 |

\* cited by examiner

*Primary Examiner*—Khanh C Tran
(74) *Attorney, Agent, or Firm*—Roylance, Abrams, Berdo & Goodman, LLP

(57) ABSTRACT

A digital predistortion apparatus is provided for predistorting a nonlinear characteristic caused by a wideband power amplifier that amplifies a input signal. The digital predistortion apparatus includes a predistorter, connected to the power amplifier via a digital-to-analog converter (DAC) and a frequency up-converter, for receiving the input signal and compensating for the nonlinear characteristic using a look-up table that depends upon a change in output power of the power amplifier. The digital predistortion apparatus further includes look-up table (LUT) updating block for adaptively updating the look-up table by comparing a feedback signal output from the power amplifier, connected thereto via an analog-to-digital converter (ADC), with the input signal output from the predistorter.

7 Claims, 8 Drawing Sheets

DIGITAL PREDISTORTION APPARATUS AND METHOD IN POWER AMPLIFIER

CROSS-REFERENCE TO RELATED APPLICATIONS

This application claims the benefit under 35 U.S.C. §119 (a) of Korean Patent Application No. 2004-33226 entitled "Digital Predistortion Apparatus And Method In Power Amplifier" filed in the Korean Intellectual Property Office on May 11, 2004, the entire disclosure of which is incorporated herein by reference.

BACKGROUND OF THE INVENTION

1. Field of the Invention

The present invention relates generally to a digital predistortion apparatus and method in a power amplifier. In particular, the present invention relates to a precompensator for linearly amplifying a wideband radio frequency (RF) signal, and an apparatus and method for adaptively controlling the precompensator.

2. Description of the Related Art

In the conventional mobile communication system using RF signals for communication, RF amplifiers are classified into categories including low-power, low-noise receive amplifiers, and high-power transmit amplifiers. In the high-power transmit amplifier, the efficiency of the amplifier, rather than noise, is taken into greater consideration. Accordingly, a high-power amplifier (HPA) typically used in a conventional mobile communication system to achieve high efficiency operates in the vicinity of its nonlinear operating point.

In this case, an output of the amplifier includes an intermodulation distortion (IMD) component that serves as a spurious signal, not only in its in-band, but also in other frequency bands. In order to delete the spurious component, a feed-forward scheme is typically used. Although the feed-forward scheme can almost completely cancel the spurious component, it has low amplification efficiency and needs to be controlled at an RF stage, thereby increasing the hardware size and system cost.

In the field of mobile communication systems, research into a high-efficiency, low-cost digital predistortion (DPD) scheme is currently being conducted. The digital predistortion scheme calculates an inverse characteristic of nonlinearity of a nonlinear amplifier at a digital stage, and predistorts an input signal using the inverse characteristic, thereby insuring substantial linearity of the output signal of the nonlinear amplifier. The nonlinear characteristics of the nonlinear amplifier can be reclassified into categories including an amplitude modulation-to-amplitude modulation (AM/AM) characteristic, in which the amplitude of an output signal changes depending on the amplitude of an input signal, and an amplitude modulation-to-phase modulation (AM/PM) characteristic, in which the phase of an output signal changes depending on the amplitude of an input signal.

The conventional digital predistorter uses a memory polynomial scheme, simplified from a Volterra scheme, as a linearization scheme for a wideband nonlinear amplifier of a mobile communication system. However, the capability to cancel the nonlinearity of an amplifier is susceptible to a memory order and a polynomial order.

In the memory polynomial-based digital predistortion scheme, the solution can be calculated using an adaptation algorithm. However, as a coefficient order is increased, a convergence speed is decreased, thereby increasing a linearization time of the nonlinear amplifier. Therefore, the convergence speed problem is one of the most important issues that should be resolved in the digital predistortion system.

The conventional Least Mean Square (LMS) algorithm has very low complexity and high stability, but has a very low convergence speed when applied to the DPD scheme. This is because the respective element values of a vector input to the LMS algorithm are dependent on each other, thereby causing a considerable increase in distribution of eigenvalues. As an alternative to the conventional LMS algorithm, there is a method for improving the convergence speed by making the respective element values become independent of each other. However, the alternative method also increases the number of calculations, implementation complexity, and the number of bits, thereby causing an increase in the cost.

Accordingly, a need exists for a system and method for canceling the nonlinearity of an amplifier, and which improves the low-convergence speed problem of the conventional LMS algorithm.

SUMMARY OF THE INVENTION

It is, therefore, an object of the present invention to provide a predistortion apparatus and method using a look-up table (LUT) value and a coefficient, which is adaptively converged based on a feedback signal from a power amplifier, thereby securing optimal performance.

It is another object of the present invention to provide an apparatus and method for correcting an LUT address according to a change in an output signal of a power amplifier, within a specific range, using a constant LUT value and a coefficient.

It is yet another object of the present invention to provide an apparatus and method for applying an LUT value and a coefficient for a plurality of consecutive Frequency Allocations (FAs).

It is still another object of the present invention to provide an apparatus and method for improving optimal performance and minimizing a convergence speed by activating an adaptation algorithm after using a dedicated look-up table.

According to one aspect of the present invention, a digital predistortion apparatus is provided for predistorting a nonlinear characteristic caused by a wideband power amplifier that amplifies a digital input signal. The apparatus comprises a predistorter, connected to the power amplifier via a digital-to-analog converter (DAC) and a frequency up-converter, for receiving the digital input signal and compensating for the nonlinear characteristic using a look-up table (LUT) that depends upon a change in the output power of the power amplifier. The apparatus further comprises a look-up table (LUT) updating block for adaptively updating the look-up table by comparing a feedback signal output from the power amplifier connected thereto via an analog-to-digital converter (ADC), with the digital input signal output from the predistorter.

According to one aspect of the present invention, a digital predistortion method is provided for predistorting a nonlinear characteristic caused by a wideband power amplifier that amplifies a digital input signal. The method comprises the steps of adaptively updating a look-up table by comparing a feedback signal output from the power amplifier operating with a particular power value, with a digital input signal output from a digital predistorter, then receiving the digital input signal and compensating for the nonlinear characteristic using the look-up table, wherein the look-up table depends upon a change in the output power of the power amplifier.

BRIEF DESCRIPTION OF THE DRAWINGS

The above and other objects, features and advantages of the present invention will become more apparent from the following detailed description when taken in conjunction with the accompanying drawings, in which.

Throughout the drawings, like reference numerals will be understood to refer to like parts, components and structures.

DETAILED DESCRIPTION OF THE EXEMPLARY EMBODIMENTS

A number of exemplary embodiments of the present invention will now be described in greater detail with reference to the annexed drawings. In the following description, detailed descriptions of known functions and configurations incorporated herein have been omitted for clarity and conciseness.

The embodiments of the present invention propose a scheme for canceling a spurious signal generated when amplifying a signal at a transmission stage in a mobile communication system. Specifically, the embodiments of the present invention use an adaptation algorithm in order to cancel a nonlinear component and a memory-effect component, which are generated after wideband amplification in the mobile communication system. A description will now be made of a process in which nonlinear components that are output from a nonlinear amplifier are removed by a digital predistortion algorithm.

Figure 1:
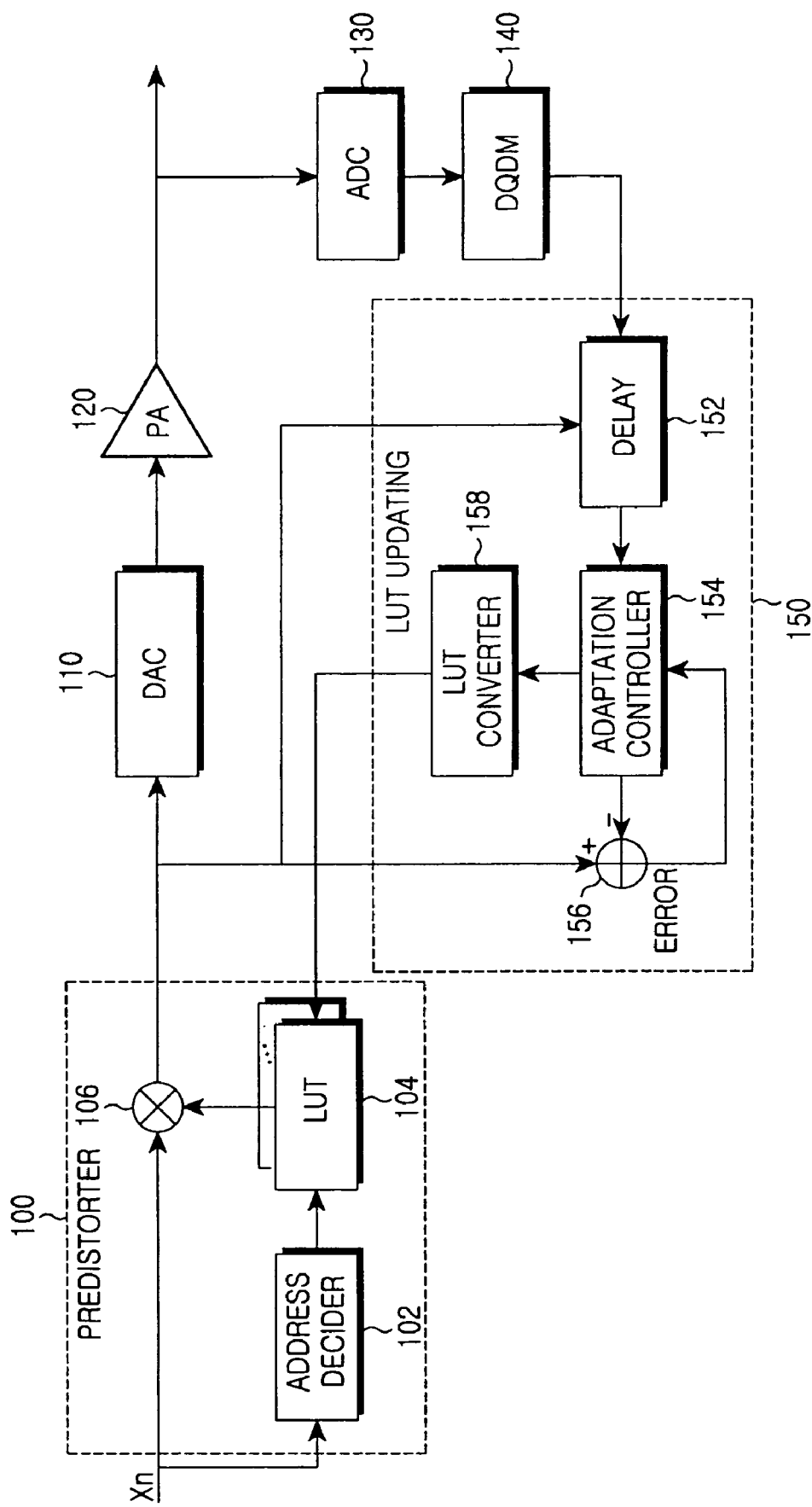
FIG. 1 is a block diagram illustrating a structure of a digital predistortion apparatus according to an embodiment of the present invention.

FIG. 1 is a block diagram illustrating a structure of a digital predistortion apparatus according to an embodiment of the present invention. Referring to FIG. 1, the digital predistortion apparatus includes a predistorter 100 for predistorting a nonlinear distortion characteristic occurring at a power amplifier 120, and a look-up table (LUT) updating block 150 for adjusting a difference between a transmission signal and a feedback signal using the feedback signal from the power amplifier 120. It is to be understood that the use of an LUT is illustrative, and that other memory storage devices and/or methods can be employed.

The predistorter 100 is connected to a power amplifier 120 via a digital-to-analog converter (DAC) 110, and is connected to the LUT updating block 150 via an analog-to-digital converter (ADC) 130 and a digital quadrature digital modulator (DQDM) 140. The LUT updating block 150 adaptively updates the look-up table 104.

An address decider 102 in the predistorter 100 calculates the intensity of an input signal Xn, and determines an address of a look-up table 104 to read a distortion control value mapped to the calculated intensity of the input signal Xn. The intensity of the input signal Xn is calculated by individually squaring an in-phase (I) signal and a quadrature-phase (Q) signal, and then summing the squared values ($I^2+Q^2$).

The look-up table 104 outputs a distortion control value corresponding to the address determined by the address decider 102. The look-up table 104 or similar apparatus stores distortion control values corresponding to a number of, or substantially all possible intensities of an input signal to the power amplifier 120. At the initial stage, the look-up table 104 stores either a predetermined value, such as '1', or a default value as determined by a manufacturer.

A multiplier 106 complex-multiplies the digital input signal Xn by the distortion control value read from the look-up table 104 to compensate for the nonlinear characteristic of the power amplifier 120. That is, the multiplier 106 multiplies a real component and an imaginary component of the digital input signal by a real component and an imaginary component of the distortion control value read from the look-up table 104, respectively, and then sums the multiplication result of the real components and the multiplication result of the imaginary components. As is well known to those skilled in the art, the imaginary components are multiplied by −1 for the imaginary multiplication.

The DAC 110 converts the digital input signal predistorted by the digital predistorter 100 into an analog signal and outputs the predistorted analog signal to a radio frequency (RF) stage (i.e., the power amplifier 120). The power amplifier 120 amplifies the predistorted analog signal output from the DAC 110, thereby canceling its nonlinear characteristic.

The signal output from the power amplifier 120 is fed back to its input via the ADC 130 which converts the analog feedback signal output from the power amplifier 120 into a digital feedback signal. A signal passing through the ADC 130 generates various images at a multiple of a sampling rate of the ADC 130. The DQDM 140 then shifts the center of a desired signal band to a direct current (DC) band to remove the images, and then removes the remaining images using a low-pass filter (LPF, not shown).

In the LUT updating block 150, a delay unit 152 calculates a delay between a transmission signal output from the predistorter 100 before being input to the power amplifier 120, and the feedback signal from the power amplifier 120. The delay unit 152 then delays the input transmission signal by the calculated value and provides the delayed signal to an adaptation controller 154.

The adaptation controller 154 updates a polynomial coefficient to be used in an LUT converter 158 using an adaptation algorithm. The adaptation algorithm used in the adaptation controller 154 searches for an optimal coefficient using Equation (1) below such that a difference between an output value and a target value becomes zero (0).

$$\underline{w}(k+1) = \underline{w}(k) + \mu \underline{u}(k) e^*(k) \quad (1)$$

In Equation (1), $\underline{w}(k)$ denotes a polynomial coefficient, $\underline{u}(k)$ denotes a signal input to the adaptation controller 154 which is based on the feedback signal, and 'e' denotes an error value determined by subtracting an output value of the adaptation controller 154 from an output value of the predistorter 100. The error signal 'e' corresponds to a signal output from an adder 156. In addition, µ denotes a convergence coefficient which is less than 1, and the asterisk (*) denotes conjugation of the error signal. The LUT converter 158 converts a polynomial coefficient converged in the adaptation controller 154 into a look-up table, thereby updating the look-up table.

Figures 2A, 2B:
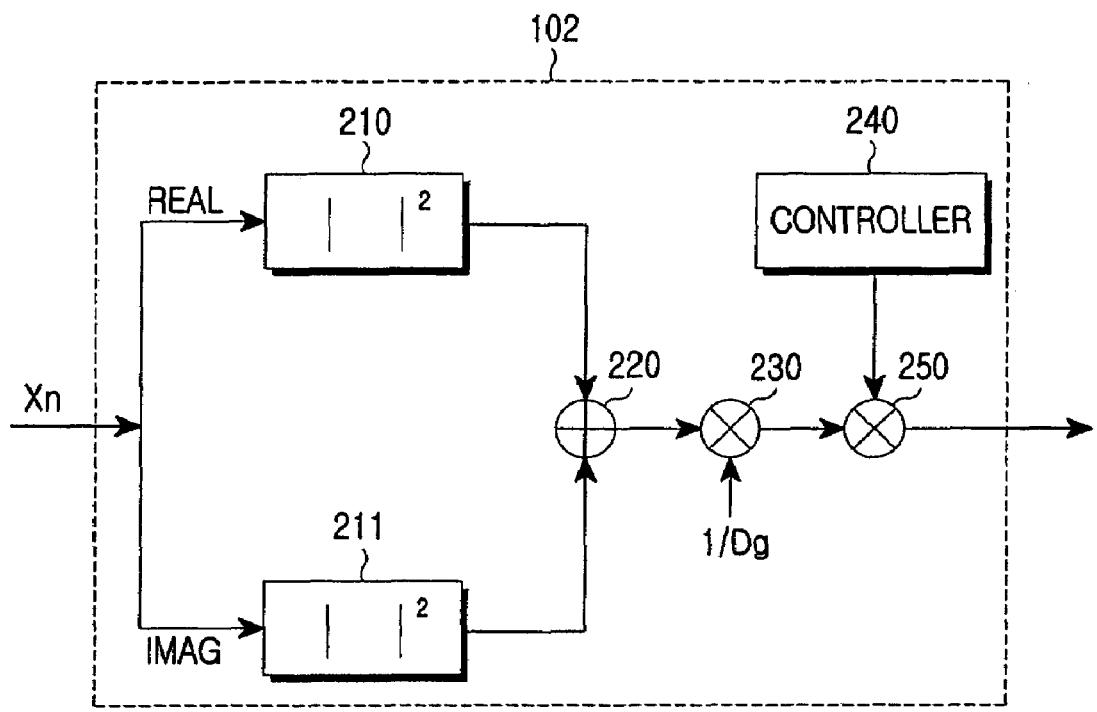
FIG. 2A is a detailed diagram illustrating a structure of the address decider illustrated in FIG. 1 according to an embodiment of the present invention.
FIG. 2B is a diagram illustrating an example of a table used for selecting a coefficient due to a change in power attenuation according to an embodiment of the present invention.

FIG. 2A is a detailed diagram illustrating a structure of the address decider 102 illustrated in FIG. 1 according to an embodiment of the present invention. Referring to FIG. 1 and FIG. 2A, the look-up table 104 uses a value that is converged to a specific power value. Therefore, it is necessary to correct an LUT addressing part in order to use the same look-up table, even when a power amplification gain varies due to a change in the value of an attenuator in a transmission path. If the attenuator's value that varies the output power is received from a central processing unit (CPU) through a message, an α value corresponding to the attenuator's value is read from the look-up table 104. If the attenuator's value is constant, the a value is output as '1'.

Referring to FIG. 2A, an input signal Xn is divided into a real-part signal and an imaginary-part signal. The real-part signal and the imaginary-part signal are squared by their squarers 210 and 211, respectively, and then added by an adder 220. The output signal of the adder 220 is divided by an LUT step size Dg in a multiplier 230, and then multiplied by a predetermined value in a multiplier 250, controlled by a controller 240, thereby generating the address value of LUT. The LUT step size Dg is calculated by dividing the maximum output power by the number of LUT entries. The address decision block is described in greater detail below with reference to the flowchart illustrated in FIG. 3.

FIG. 2B is a diagram illustrating an example of a table used for selecting a coefficient due to a change in power attenuation according to an embodiment of the present invention. In the table of FIG. 2B, coefficients of α1, α2, and α3, are mapped to power attenuations of 0 [dB], −0.1 [dB], and −0.2 [dB], respectively. As shown, the coefficients and power attenuation values of the table of FIG. 2B can be continued in a similar manner.

Figure 3:
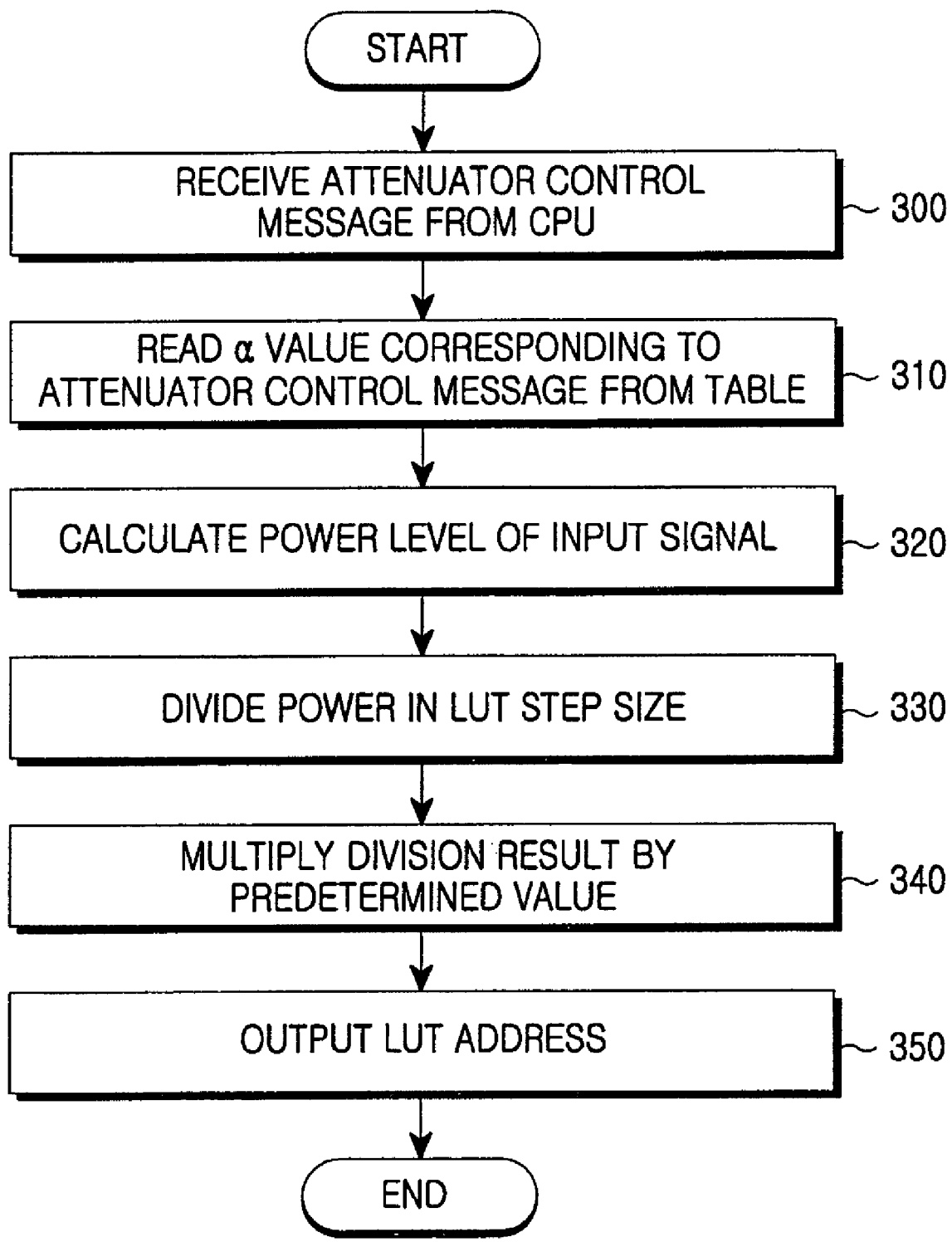
FIG. 3 is a flowchart for illustrating a method for calculating an LUT address in an address decider according to an embodiment of the present invention.

FIG. 3 is a flowchart for illustrating a method for calculating an LUT address in an address decider according to an embodiment of the present invention. Referring to FIG. 3, the address decider 102 receives an attenuator control message from a CPU in step 300, and reads an a value corresponding to the message from the table in step 310.

The address decider 102 calculates the power of an input signal in step 320, and divides the power of the input signal by an LUT step size Dg in step 330. Thereafter, the address decider 102 multiplies the division result by an α value in step 340, and finally outputs an LUT address in step 350.

Figure 4:
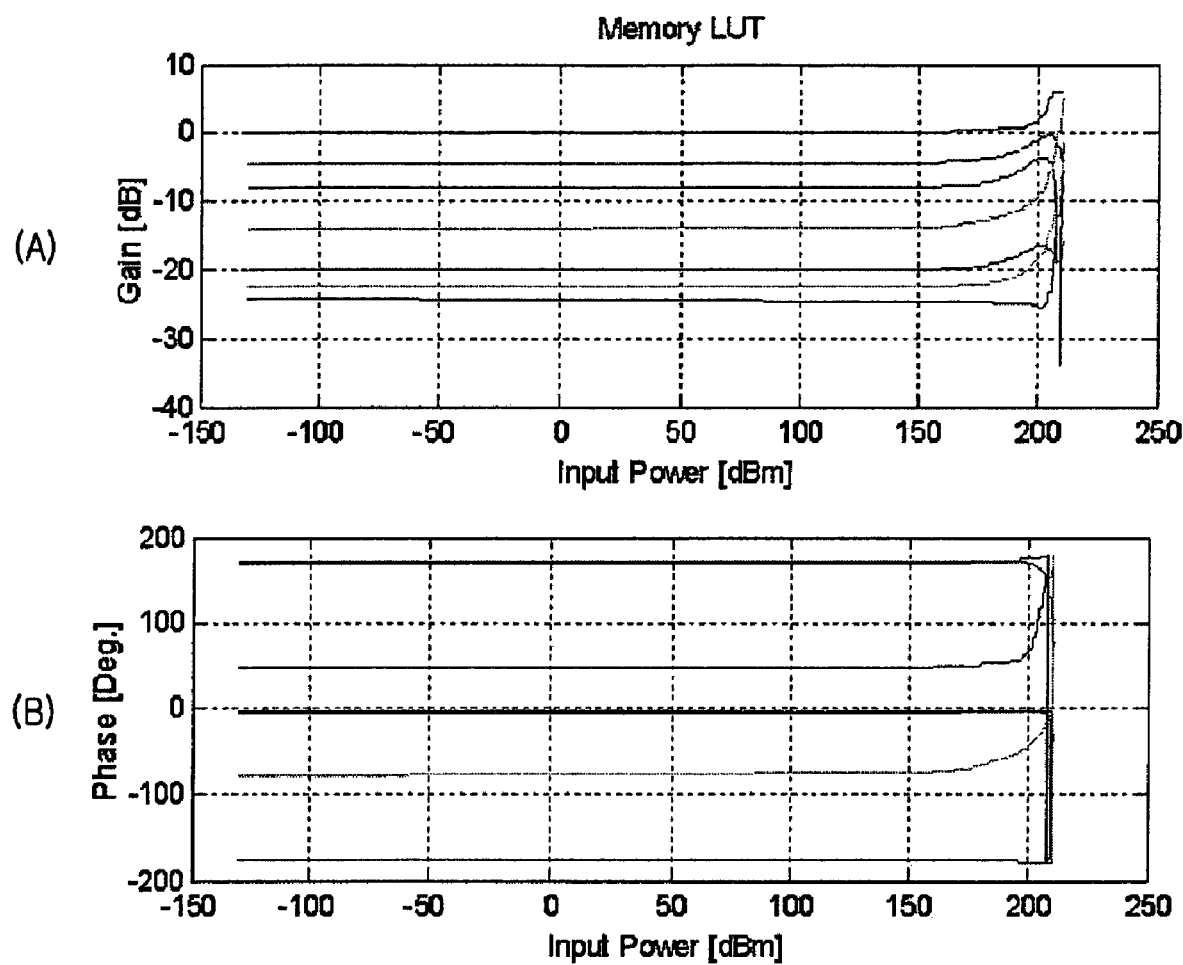
FIG. 4 illustrates gain and phase characteristic graphs for an input signal with an LUT value converged using an adaptation control scheme according to an embodiment of the present invention.

FIG. 4 illustrates gain and phase characteristic graphs for an input signal with an LUT value converged using an adaptation control scheme according to an embodiment of the present invention. The look-up table stores a gain control value and a phase control value for controlling the distortion of an input signal according to a level of the input signal. These values are estimated through an adaptation algorithm.

In the gain graph (A) shown at the top of FIG. 4, the number of memory taps considered is 7 and a polynomial order is 10. The present invention aims at reducing a convergence time using the converged look-up table shown in FIG. 4.

Figure 5:
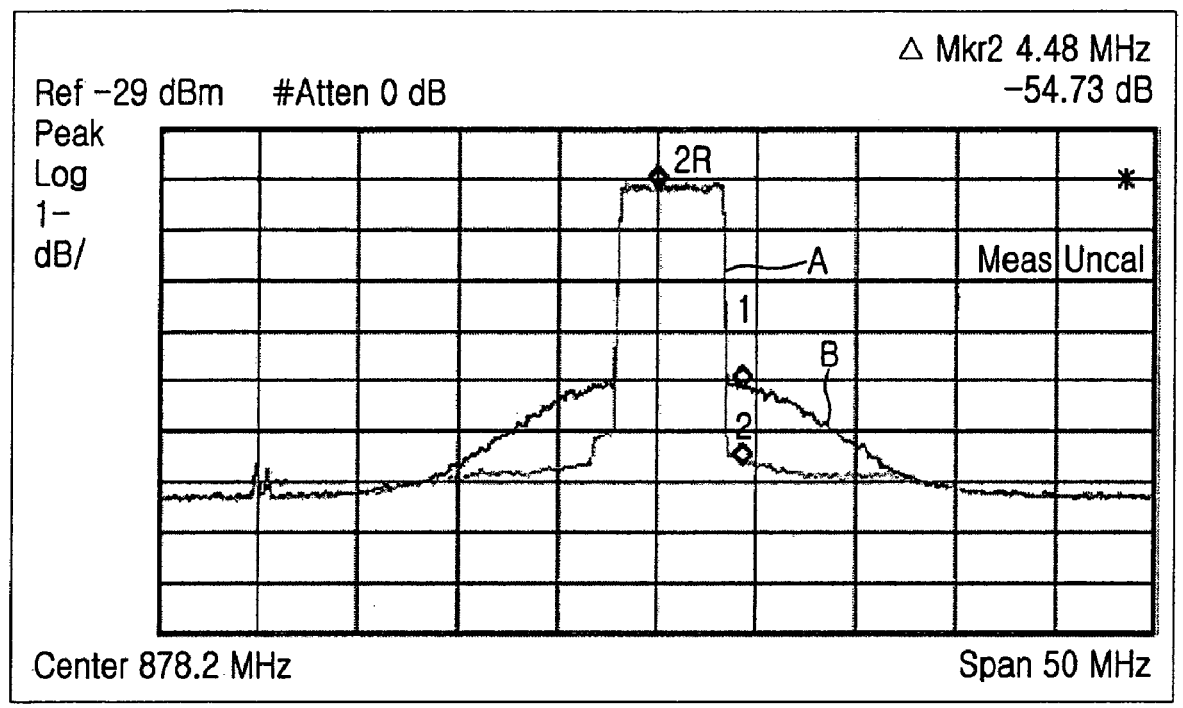
FIG. 5 is a diagram illustrating a simulation result for a digital predistortion apparatus according to an embodiment of the present invention.

FIG. 5 is a diagram illustrating a simulation result for a digital predistortion apparatus according to an embodiment of the present invention. Referring to FIG. 5, a "green" spectrum, represented by line A, shows an output spectrum of a power amplifier (PA) in the case where a digital predistorter (DPD) is inactivated. A "cyan" spectrum, represented by line B, shows an output spectrum of the power amplifier in the case where the open-loop digital predistorter is activated using the look-up table converged according to an embodiment of the present invention. It can be noted from FIG. 5 that an IMD component of about 15 dB is canceled by the digital predistortion operation.

Figure 6A:
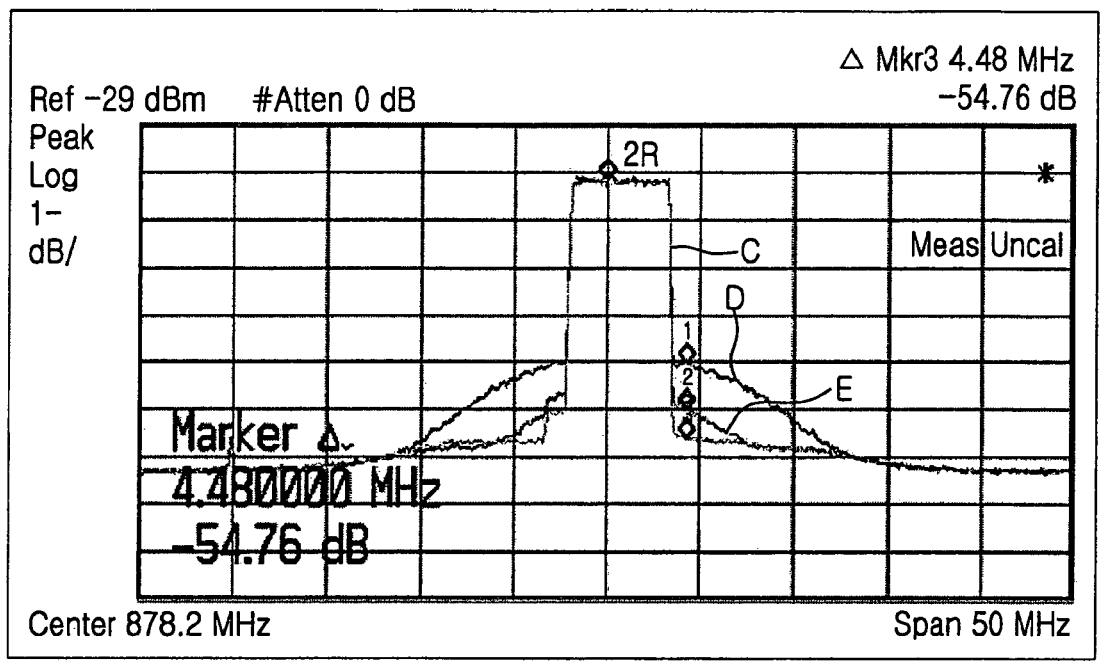
FIG. 6A is a diagram illustrating a simulation result in the case where a look-up table, converged in a first power amplifier according to an embodiment of the present invention, is applied to a second power amplifier.

FIG. 6A is a diagram illustrating a simulation result in the case where a look-up table, converged in a first power amplifier according to an embodiment of the present invention, is applied to a second power amplifier. FIG. 6A illustrates a simulation result obtained when a look-up table, converged in a first power amplifier, is applied to a second power amplifier. In FIG. 6A, a "green" spectrum, represented by line C, shows a spurious signal occurring when a signal, to which the digital predistortion is not applied, passes through the second power amplifier. A "cyan" spectrum, represented by line D, shows that a DPD performance is reduced by about 6 dB due to a PA characteristic difference when the look-up table, converged in the first power amplifier, is applied to the second power amplifier.

A "magenta" spectrum represented by line E, shows a simulation result obtained when the adaptation algorithm is performed on the second power amplifier using the look-up table converged in the first power amplifier and a coefficient, and shows that it reaches the DPD performance level of FIG. 5 in a convergence time of about 3 seconds. That is, it is shown that with the use of the converged look-up table and the coefficient, an adjacent channel leakage ratio (ACLR) of 44 dBc separated by 1.98 MHz from a required spectrum mask is satisfied even in an open-loop performance simulation, and an ACLR of 55 dBc is satisfied within a short time even in a closed-loop performance simulation.

Figure 6B:
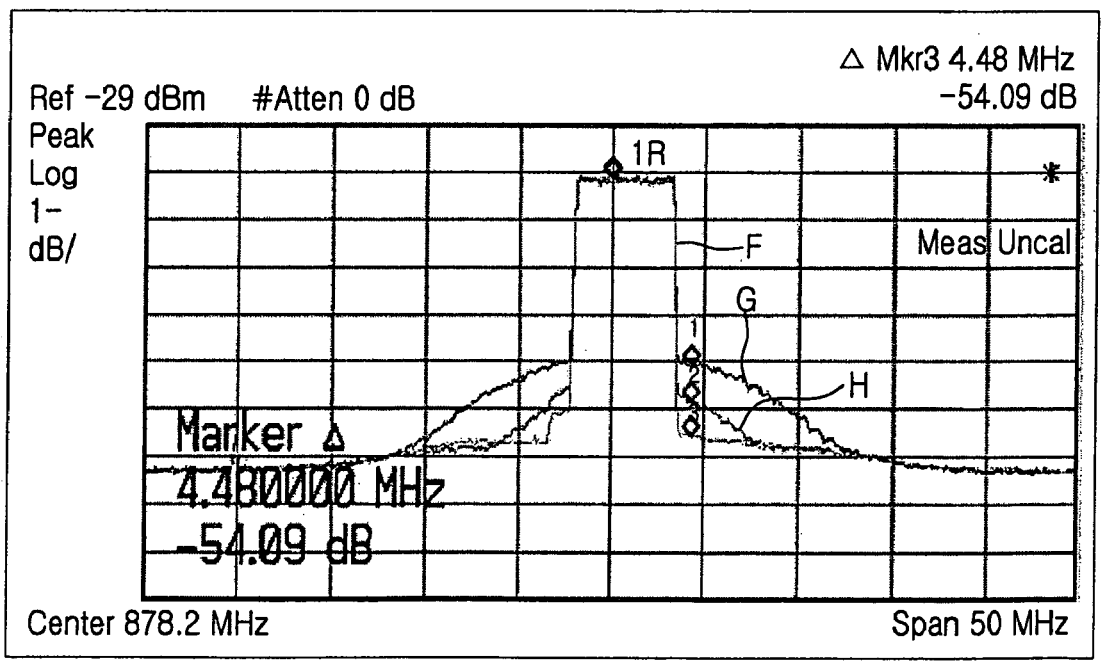
FIG. 6B is a diagram illustrating a simulation result in the case where a look-up table, converged in a first power amplifier according to an embodiment of the present invention, is applied to a third power amplifier.

FIG. 6B is a diagram illustrating a simulation result in the case where a look-up table, converged in a first power amplifier according to an embodiment of the present invention, is applied to a third power amplifier. FIG. 6B illustrates a simulation result obtained when a look-up table converged in a first power amplifier is applied to a third power amplifier, in substantially the same manner as described with reference to FIG. 6A.

Similarly, in FIG. 6B, a "green" spectrum represented by line F, shows a spurious signal occurring when a signal, to which the digital predistortion is not applied, passes through the third power amplifier. A "cyan" spectrum represented by line G, shows that a DPD performance is reduced by about 7 dB due to a PA characteristic difference when the look-up table, converged in the first power amplifier, is applied to the third power amplifier. A "magenta" spectrum represented by line H, shows a simulation result obtained when the adaptation algorithm is performed on the third power amplifier using the look-up table converged in the first power amplifier and a coefficient, and shows that it reaches the DPD performance level of FIG. 5 in a convergence time of about 3 seconds. This simulation also shows that an open-loop performance satisfies a spectrum mask, and that a close-loop performance is also satisfied within a short time.

Figure 7A:
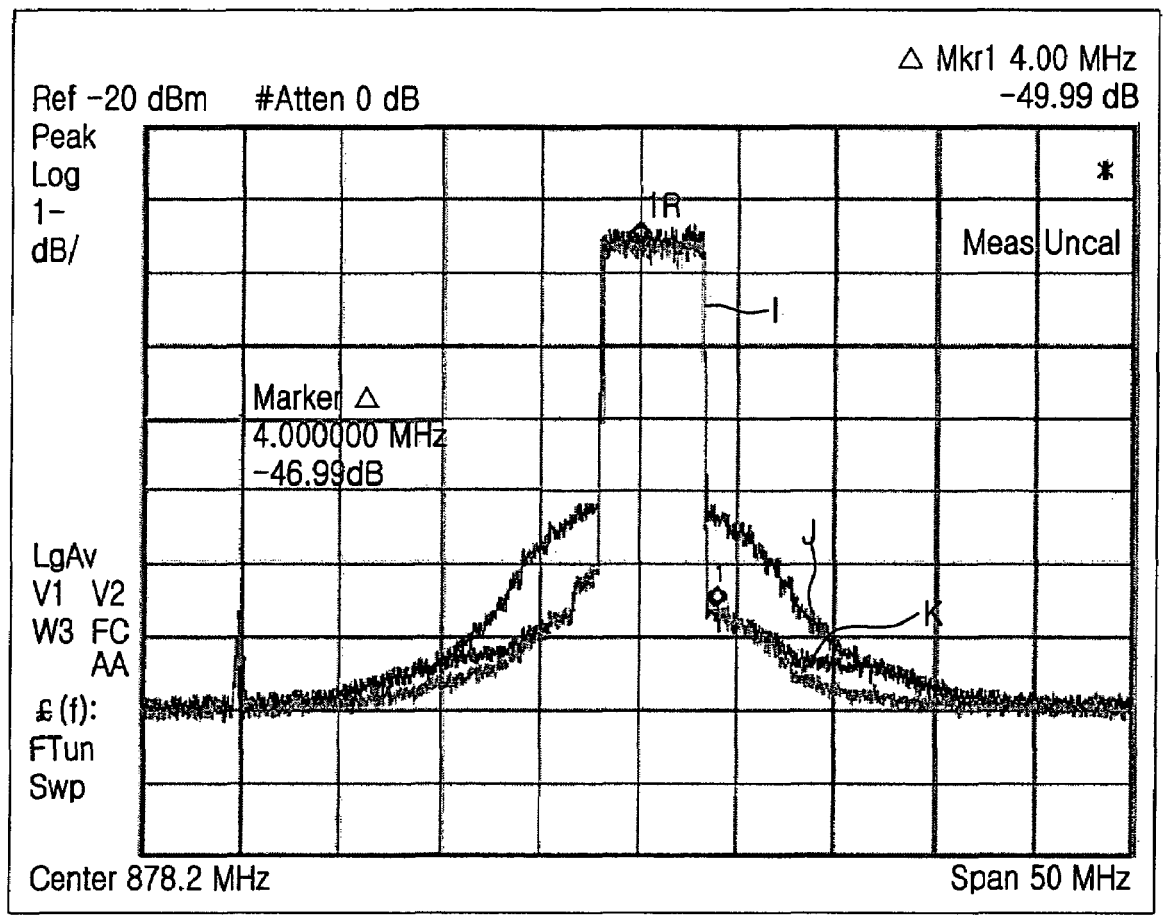
FIGS. 7A and 7B are diagrams illustrating an operation of a previously converged look-up table with respect to a change in output power of a power amplifier according to an embodiment of the present invention.
Figure 7B:
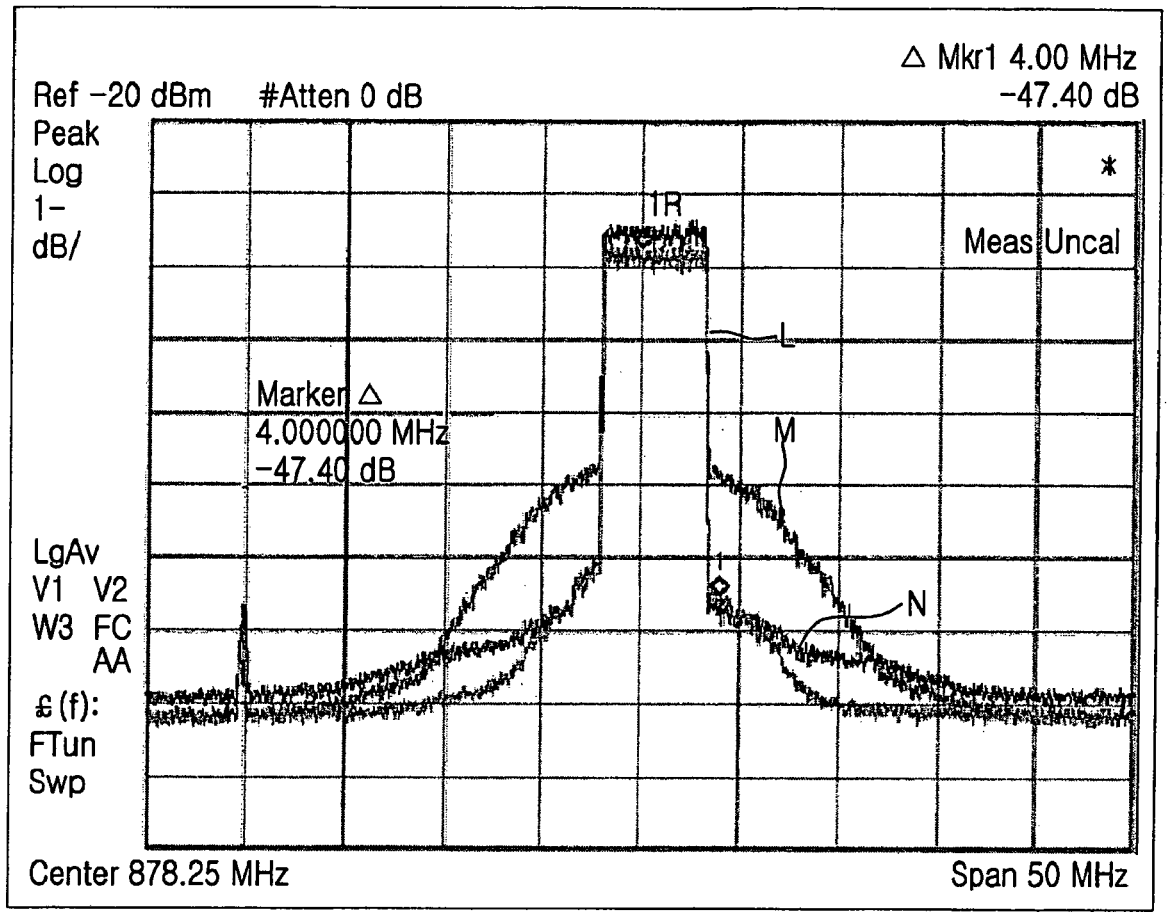

In addition, it can be noted from FIGS. 7A and 7B that when the PA output power is changed by an analog attenuator in an RF stage, an address decision block for a converged look-up table should compensate for the analog attenuator's value.

FIGS. 7A and 7B are diagrams illustrating an operation of a previously converged look-up table with respect to a change in output power of a power amplifier according to an embodiment of the present invention.

Referring to FIG. 7A, a "green" spectrum represented by line I, is a spectrum obtained when transmission is achieved with the same output power using a look-up table converged at a PA output power of 47.3 dBm. A "cyan" spectrum represented by line J, is a spectrum obtained when a PA output power changes to 46.3 dBm by using a look-up table converged at 47.3 dBm and applying 1 dB to an analog attenuator. A "magenta" spectrum represented by line K, shows that the previous look-up table can be used if the previously converged LUT address decision block compensates for the 1 dB decrease in the PA output power.

Referring to FIG. 7B, a "green" spectrum represented by line L, is a spectrum obtained when transmission is achieved with the same output power using a look-up table converged at a PA output power of 47.3 dBm. A "cyan" spectrum represented by line M, is a spectrum obtained when a PA output power changes to 44.3 dBm by using a look-up table converged at 47.3 dBm and applying 3 dB to an analog attenuator. A "magenta" spectrum represented by line N, shows that the previous look-up table can be used if the previously converged LUT address decision block compensates for the 3 dB decrease in the PA output power.

As can be understood from the foregoing description, the novel digital predistortion system of the exemplary embodiments of the present invention can cancel an IMD component of a nonlinear amplifier and guarantee high performance of a mobile communication system. In addition, the novel digital predistortion system of the exemplary embodiments of the present invention can solve the low-convergence speed problem of the conventional LMS algorithm, and satisfy the spec-in requirement that the look-up table should be converged to the optimal spectrum at the initial stage of the system operation. Further, when there is an environmental change of a specific range, the specific range can be covered with one look-up table through a correction algorithm of an LUT address controller, thereby contributing to an increase in memory efficiency and a decrease in complexity.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A digital predistortion apparatus for compensating by predistorting a nonlinear characteristic caused by a power amplifier that amplifies an input signal, the apparatus comprising:
   a predistorter, electrically connected to the power amplifier via a digital-to-analog converter (DAC), for receiving the input signal and compensating for the nonlinear characteristic using a look-up table that depends upon a change in output power of the power amplifier; and
   a look-up table (LUT) updating block, electrically connected to the predistorter, for comparing a feed-back signal outputted from the power amplifier with a first signal outputted from the predistorter, and adaptively updating the look-up table using the compared result,
   wherein the LUT updating block comprises:
   a delay unit for calculating a time delay between the first signal and the feed-back signal, delaying the first signal by the calculated time delay, and providing the delayed first signal to an adaptation controller;
   the adaptation controller for updating a polynomial coefficient converged to reduce a difference between an output value and a target value; and
   an LUT converter for converting the polynomial coefficient converged in the adaptation controller into a look-up table to update the look-up table.

2. The digital predistortion apparatus of claim 1, wherein the predistorter comprises:
   a look-up table converged at a specific power value;
   an address decider for calculating an intensity of the input signal and determining an address of the look-up table according to a change in output power of the power amplifier; and
   a multiplier for multiplying the input signal by a value read from the look-up table using the determined address.

3. The digital predistortion apparatus of claim 2, wherein the address decider comprises:
   a controller including a table in which an output power is matched to a coefficient value for selecting a look-up table corresponding to the output power, wherein the controller is programmable to output a coefficient to which a value for changing the output power is mapped;
   squarers for individually squaring a real-part signal and an imaginary-part signal, wherein the real-part signal and the imaginary-part signal are obtained by dividing the input signal;
   an adder for adding signals outputted from the squarers;
   a first multiplier for dividing the added signal by an LUT step size; and
   a second multiplier for multiplying a signal outputted from the first multiplier by the coefficient value.

4. A digital predistortion method for predistorting a nonlinear characteristic caused by a power amplifier that amplifies an input signal, the method comprising the steps of:
   calculating a time delay between a first signal outputted from the predistorter and a feedback signal outputted from the power amplifier;
   delaying the first signal by the calculated time delay, and providing the delayed first signal to an adaptation controller;
   updating a polynomial coefficient converged to reduce a difference between an output value and a target value; and
   converting the polynomial coefficient converged in the adaptation controller into a look-up to update the look-up table.

5. A digital predistortion apparatus for compensating by predistorting a nonlinear characteristic caused by a power amplifier that amplifies an input signal, the apparatus comprising:
   a predistorter, electrically connected to the power amplifier via a digital-to-analog converter (DAC), for receiving the input signal and compensating for the nonlinear characteristic using a data storage device that depends upon a change in output power of the power amplifier; and
   a data storage device updating block, electrically connected to the predistorter;
   wherein the data storage device updating block comprises:
   a delay unit for calculating a time delay between a first signal outputted from the predistorter and a feedback signal outputted from the power amplifier, delaying the first signal by the calculated time delay, and providing the delayed first signal to an adaptation controller;

the adaptation controller for updating a polynomial coefficient converged to reduce a difference between an output value and a target value; and a data storage device converter for converting the polynomial coefficient converged in the adaptation controller to update the data storage device.

6. The digital predistortion apparatus of claim 5, wherein the predistorter comprises:

a data storage device converged at a specific power value;

an address decider for calculating an intensity of the input signal and determining an address of the data storage device according to a change in output power of the power amplifier; and a multiplier for multiplying the input signal by a value read from the data storage device using the calculated address.

7. The digital predistortion apparatus of claim 6, wherein the address decider comprises:

a controller including a table in which an output power is matched to a coefficient value for selecting a data storage device corresponding to the output power, wherein the controller is programmable to output a coefficient to which a value for changing the output power is mapped;

squarers for individually squaring a real-part signal and an imaginary-part signal, wherein the real-part signal and the imaginary-part signal are obtained by dividing the input signal;

an adder for adding signals outputted from the squarers;

a first multiplier for dividing the added signal by a step size; and a second multiplier for multiplying a signal outputted from the first multiplier by the coefficient value.

* * * * *